(12) United States Patent
Fukazawa et al.

(10) Patent No.: US 11,821,092 B2
(45) Date of Patent: Nov. 21, 2023

(54) ETCHANT FOR SELECTIVELY ETCHING COPPER AND COPPER ALLOY, AND METHOD FOR MANUFACTURING SEMICONDUCTOR SUBSTRATE USING SAID ETCHANT

(71) Applicant: MITSUBISHI GAS CHEMICAL COMPANY, INC., Chiyoda-ku (JP)

(72) Inventors: Shun Fukazawa, Ashigarakami-gun (JP); Tomoko Fujii, Ashigarakami-gun (JP); Hiroshi Matsunaga, Ashigarakami-gun (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 190 days.

(21) Appl. No.: 17/287,049

(22) PCT Filed: Nov. 19, 2019

(86) PCT No.: PCT/JP2019/045158
§ 371 (c)(1),
(2) Date: Apr. 20, 2021

(87) PCT Pub. No.: WO2020/105605
PCT Pub. Date: May 28, 2020

(65) Prior Publication Data
US 2021/0381113 A1     Dec. 9, 2021

(30) Foreign Application Priority Data

Nov. 20, 2018   (JP) ................................ 2018-217067

(51) Int. Cl.
*C23F 1/18*          (2006.01)
*H01L 21/768*     (2006.01)
(Continued)

(52) U.S. Cl.
CPC .......... *C23F 1/18* (2013.01); *H01L 21/76802* (2013.01); *H01L 23/5226* (2013.01);
(Continued)

(58) Field of Classification Search
CPC ...... C23F 1/18; C23F 1/02; C23F 1/44; H01L 21/76802; H01L 23/5226; H01L 23/53228;
(Continued)

(56) References Cited

U.S. PATENT DOCUMENTS 8,900,478 B2    12/2014   Hosomi et al.
2012/0319033 A1 12/2012   Okabe et al.
(Continued)

FOREIGN PATENT DOCUMENTS

CN         106435587 A      2/2017
EP         2 537 960 A1    12/2012
(Continued)

OTHER PUBLICATIONS

Extended European Search Report dated Dec. 8, 2021 in corresponding European Patent Application No. 19886247.6, 8 pages.
(Continued)

*Primary Examiner* — Douglas W Owens
(74) *Attorney, Agent, or Firm* — Oblon, McClelland, Maier & Neustadt, L.L.P.

(57) ABSTRACT

An etchant capable of selectively etching copper and a copper alloy while suppressing dissolution of nickel, tin, gold, and an alloy thereof. The etchant contains: (A) 5-10.5% by mass of hydrogen peroxide with respect to the total mass of the etchant; (B) 0.3-6% by mass of nitric acid with respect to the total mass of the etchant; (C) at least one nitrogen-containing 5-membered ring compound selected from triazoles and tetrazoles, which may have at least one substituent selected from a C1-6 alkyl group, an amino
(Continued)

group, and a substituted amino group having a substituent selected from a C1-6 alkyl group and a phenyl group; and (D) (d1) one or more pH adjusters selected from an alkali metal hydroxide, ammonia, an amine, and an ammonium salt, (d2) a phosphoric acid compound, or (d3) a combination of (d1) and (d2).

20 Claims, 4 Drawing Sheets

(51) Int. Cl.
    *H01L 23/522*     (2006.01)
    *H01L 23/532*     (2006.01)
    *H01L 23/00*     (2006.01)

(52) U.S. Cl.
    CPC ........ *H01L 23/53228* (2013.01); *H01L 24/11* (2013.01); *H01L 24/14* (2013.01)

(58) Field of Classification Search
    CPC ......... H01L 24/11; H01L 24/14; H01L 24/05; H01L 2224/03614; H01L 2224/03912; H01L 2224/0401; H01L 2224/05073; H01L 2224/05166; H01L 2224/05647; H01L 2224/11462; H01L 2224/1147; H01L 2224/13022; H01L 2224/13111; H01L 2224/13144; H01L 2224/13147; H01L 2224/13155; H01L 21/76898; H01L 21/32134; H01L 24/03; H01L 24/13; H01L 2224/1146; H01L 2224/11622; H01L 2224/13082

See application file for complete search history.

(56) References Cited

U.S. PATENT DOCUMENTS

| | | |
|---|---|---|
| 2013/0048904 A1 | 2/2013 | Adaniya et al. |
| 2014/0162403 A1 | 6/2014 | Okabe et al. |
| 2018/0298500 A1 * | 10/2018 | Takahashi ................ C23F 1/46 |

FOREIGN PATENT DOCUMENTS

| | | | | |
|---|---|---|---|---|
| JP | 2004-43895 A | | 2/2004 | |
| JP | 5051323 B2 | * | 10/2012 | ................ C23F 1/18 |
| JP | 2016-98386 A | | 5/2016 | |
| WO | WO 2011/074589 A1 | | 6/2011 | |
| WO | WO 2011/099624 A1 | | 8/2011 | |
| WO | WO 2015/075765 A1 | | 5/2015 | |
| WO | WO 2017/188108 A1 | | 11/2017 | |

OTHER PUBLICATIONS

International Search Report dated Dec. 17, 2019 in PCT/JP2019/045158 filed on Nov. 19, 2019, 1 page.
Combined Taiwanese Office Action and Search Report dated May 8, 2023 in Patent Application No, 108141854 (with English translation of Category of Cited Documents), 14 pages.

* cited by examiner

ETCHANT FOR SELECTIVELY ETCHING COPPER AND COPPER ALLOY, AND METHOD FOR MANUFACTURING SEMICONDUCTOR SUBSTRATE USING SAID ETCHANT

CROSS-REFERENCE TO RELATED APPLICATIONS

This application is a national stage application of International Application No. PCT/JP2019/045158, filed Nov. 19, 2019, which is based upon and claims the benefit of priority to Japanese Patent Application No. 2018-217067, filed Nov. 20, 2018. The entire contents of these applications are incorporated herein by reference.

TECHNICAL FIELD

The present invention relates to an etchant for selectively etching at least one selected from the group consisting of copper and a copper alloy and a method for producing a semiconductor substrate using the same.

BACKGROUND ART

For wiring formation of a semiconductor substrate in which a bump such as TSV (Through Silicon Via) is used typified by next-generation DRAM memories and NAND memories, it is required to use a technique of selectively etching copper and a copper alloy while suppressing dissolution of nickel, a nickel alloy, tin, a tin alloy, gold and a gold alloy.

Techniques of selectively etching copper and a copper alloy while suppressing dissolution of nickel and a nickel alloy are known (e.g., Patent Literatures 1-3).

However, regarding the case where tin, gold and an alloy thereof are included as wiring materials in addition to nickel and a nickel alloy, a technique of selectively etching copper and a copper alloy while suppressing dissolution of these metals has not been examined.

For example, Patent Literature 1 discloses an etchant containing hydrogen peroxide and nitric acid at a predetermined concentration ratio. However, in the case where tin and gold are included as wiring materials, dissolution of nickel cannot be prevented when using this etchant.

CITATION LIST

Patent Literature

Patent Literature 1: Japanese Laid-Open Patent Publication No. 2004-43895
Patent Literature 2: International Publication WO2011/074589 pamphlet
Patent Literature 3: International Publication WO2017/188108 pamphlet

SUMMARY OF INVENTION

Technical Problem

Under the above-described circumstances, it has been desired to provide an etchant, wherein, when at least one selected from the group consisting of nickel and a nickel alloy and at least one selected from the group consisting of tin, a tin alloy, gold and a gold alloy are included as wiring materials, copper and a copper alloy can be selectively etched while suppressing dissolution of these metals, and which can be suitably used for wiring formation of a semiconductor substrate in which a bump is used.

Solution to Problem

The present inventors diligently made researches with respect to the above-described problem and found that it can be solved by an etchant having a specific composition described below.

Specifically, the present invention provides an etchant, a method for producing a semiconductor substrate, etc. described below.

[1] An etchant for selectively etching at least one selected from the group consisting of copper and a copper alloy in a semiconductor substrate that comprises: said at least one selected from the group consisting of copper and the copper alloy; at least one selected from the group consisting of nickel and a nickel alloy; and at least one selected from the group consisting of tin, a tin alloy, gold and a gold alloy, the etchant comprising:
(A) 5 to 10.5% by mass of hydrogen peroxide relative to the total mass of the etchant;
(B) 0.3 to 6% by mass of nitric acid relative to the total mass of the etchant;
(C) at least one nitrogen-containing 5-membered ring compound selected from the group consisting of triazoles and tetrazoles, which may have at least one substituent selected from the group consisting of a $C_{1-6}$ alkyl group, an amino group, and a substituted amino group having at least one substituent selected from the group consisting of a $C_{1-6}$ alkyl group and a phenyl group; and
(D) (d1) at least one pH adjuster selected from the group consisting of an alkali metal hydroxide, ammonia, an amine, and an ammonium salt, (d2) a phosphonic acid compound, or (d3) a combination of (d1) and (d2).
[2] The etchant according to item [1], wherein the component (C) is at least one nitrogen-containing 5-membered ring compound selected from the group consisting of 5-methyltetrazole, 5-aminotetrazole and 1,2,4-triazole.
[3] The etchant according to item [1] or [2], wherein the concentration of the component (C) is 0.005 to 2.0% by mass relative to the total mass of the etchant.
[4] The etchant according to any one of items [1] to [3], having a pH of 0.5 to 3.0.
[5] The etchant according to any one of items [1] to [3], comprising (d2) the phosphonic acid compound.
[6] The etchant according to any one of items [1] to [5], wherein the component (d2) is at least one phosphonic acid compound selected from the group consisting of 1-hydroxyethylidene-1,1-diphosphonic acid, diethylenetriaminepenta(methylenephosphonic acid) and a salt thereof.
[7] The etchant according to any one of items [1] to [6], wherein the concentration of the component (d2) is 0.005 to 1.0% by mass relative to the total mass of the etchant.
[8] A method for producing a semiconductor substrate, comprising:
a step of preparing a semiconductor base material having, on its surface, a copper seed layer containing at least one selected from the group consisting of copper and a copper alloy;

a step of forming a resist pattern having an opening pattern, wherein the copper seed layer is partially exposed;

a step of forming a metal layer A containing at least one selected from the group consisting of nickel and a nickel alloy and a metal layer B containing at least one selected from the group consisting of tin, a tin alloy, gold and a gold alloy to be arranged in this order on the surface of the copper seed layer exposed at an opening of the opening pattern of the resist pattern;

a step of removing the resist pattern; and a step of bringing an exposed portion of the copper seed layer on which the metal layer A and the metal layer B are not formed, which is generated by removing the resist pattern, into contact with the etchant according to any one of items [1] to [7] to etch the exposed portion of the copper seed layer.

[9] The method for producing the semiconductor substrate according to item [8], wherein a bump comprising the metal layer A containing at least one selected from the group consisting of nickel and the nickel alloy and the metal layer B containing at least one selected from the group consisting of tin, the tin alloy, gold and the gold alloy is formed on the semiconductor base material.

Advantageous Effects of Invention

According to the present invention, an etchant for selectively etching copper and a copper alloy can be provided. Further, according to the present invention, a method for producing a semiconductor substrate using the etchant can be provided.

According to a preferred embodiment of the present invention, by using the etchant, copper and a copper alloy can be selectively etched while suppressing dissolution of nickel, a nickel alloy, tin, a tin alloy, gold and a gold ally. Further, according to a preferred embodiment of the present invention, the etchant can be suitably used for wiring formation of a semiconductor substrate in which a bump is used.

BRIEF DESCRIPTION OF DRAWINGS

FIG. 1(a) to FIG. 1(c) are process drawings schematically showing an example of the step of preparing a base material.

DESCRIPTION OF EMBODIMENTS

Hereinafter, the etchant, the method for producing a semiconductor substrate, etc. of the present invention will be specifically described, but the present invention is not limited thereto and can be variously modified within a range not departing from the gist of the present invention.

1. Etchant

The etchant of the present invention is characterized in that it is an etchant for selectively etching at least one selected from the group consisting of copper and a copper alloy in a semiconductor substrate that comprises: said at least one selected from the group consisting of copper and the copper alloy; at least one selected from the group consisting of nickel and a nickel alloy; and at least one selected from the group consisting of tin, a tin alloy, gold and a gold alloy, and that the etchant comprises:

(A) 5 to 10.5% by mass of hydrogen peroxide relative to the total mass of the etchant;

(B) 0.3 to 6% by mass of nitric acid relative to the total mass of the etchant;

(C) at least one nitrogen-containing 5-membered ring compound selected from the group consisting of triazoles and tetrazoles, which may have at least one substituent selected from the group consisting of a $C_{1-6}$ alkyl group, an amino group, and a substituted amino group having at least one substituent selected from the group consisting of a $C_{1-6}$ alkyl group and a phenyl group; and (D) (d1) at least one pH adjuster selected from the group consisting of an alkali metal hydroxide, ammonia, an amine, and an ammonium salt, (d2) a phosphonic acid compound, or (d3) a combination of (d1) and (d2).

According to a preferred embodiment of the present invention, the etchant of the present invention contains a specific component at a specific ratio as described above, and because of this, when at least one selected from the group consisting of nickel and a nickel alloy and at least one selected from the group consisting of tin, a tin alloy, gold and a gold alloy are included as wiring materials, copper and a copper alloy can be selectively etched while suppressing dissolution of the above-described metals. Note that in this specification, the "nickel alloy" is a material obtained by adding at least one metallic element or non-metallic element to nickel and is not particularly limited as long as it has a metallic property. The same applies to the "tin alloy", the "gold alloy" and the "copper alloy".

Hereinafter, respective components contained in the etchant of the present invention will be described in detail.

[Hydrogen Peroxide (A)]

In the present invention, hydrogen peroxide (A) (hereinafter also referred to as "the component (A)") is a component that functions as an oxidant for copper.

The grade of hydrogen peroxide (A) is not particularly limited, and hydrogen peroxides with various grades such as industrial/electronics industrial grade can be used. In general, hydrogen peroxide (A) is preferably used in the form of an aqueous hydrogen peroxide solution in view of availability and operability.

The concentration of hydrogen peroxide (A) in the etchant is 5 to 10.5% by mass, and preferably 6.0 to 10.0% by mass relative to the total mass of the etchant. When the concentration of hydrogen peroxide (A) is within the above-described range, a satisfactory etching rate is obtained. In addition, dissolution of wiring materials can be suppressed.

[Nitric Acid (B)]

In the present invention, nitric acid (B) (hereinafter also referred to as "the component (B)") is a component that acts as an etchant for copper and the copper alloy oxidized by hydrogen peroxide.

The concentration of nitric acid (B) in the etchant is 0.3 to 6% by mass, preferably 0.5 to 5.0% by mass, and more preferably 1.0 to 4.0% by mass. When the concentration of nitric acid (B) is within the above-described range, a satis- factory etching rate is obtained. In addition, dissolution of wiring materials can be suppressed.

[Nitrogen-Containing 5-Membered Ring Compound (C)]

In the present invention, it is considered that the nitrogen-containing 5-membered ring compound (C) (hereinafter also referred to as "the component (C)") has a function to adsorb to the copper surface to control the etching rate of copper and to reduce corrosion of nickel and tin.

The nitrogen-containing 5-membered ring compound (C) is at least one selected from the group consisting of triazoles and tetrazoles, which may have at least one substituent selected from the group consisting of a $C_{1-6}$ alkyl group, an amino group, and a substituted amino group having at least one substituent selected from the group consisting of a $C_{1-6}$ alkyl group and a phenyl group. As the nitrogen-containing 5-membered ring compound (C), one material may be used solely, or two or more materials may be used in combination.

Preferred examples of the nitrogen-containing 5-membered ring compound (C) include a compound represented by formula (1), formula (2) or formula (3):

In formula (1) to formula (3), $R^1$, $R^2$, $R^3$, $R^4$ and $R^5$ are each independently selected from the group consisting of (i) a hydrogen atom, (ii) a $C_{1-6}$ alkyl group, (iii) an amino group and (iv) a substituted amino group having at least one substituent selected from the group consisting of a $C_{1-6}$ alkyl group and a phenyl group.

Examples of the $C_{1-6}$ alkyl group include a linear or branched alkyl group and a cycloalkyl group. Examples of the linear or branched alkyl group include a methyl group, an ethyl group, an n-propyl group, an isopropyl group, an n-butyl group, an isobutyl group, a sec-butyl group, a tert-butyl group, an n-pentyl group and an n-hexyl group. Examples of the cycloalkyl group include a $C_{3-6}$ cycloalkyl group, and examples thereof include a cyclopropyl group, a cyclopentyl group and a cyclohexyl group. Among them, a methyl group or an ethyl group is preferred, and a methyl group is particularly preferred.

The substituted amino group is not particularly limited as long as it is an amino group having at least one substituent selected from the group consisting of a $C_{1-6}$ alkyl group and a phenyl group. The $C_{1-6}$ alkyl group is as explained with examples above.

Preferred specific examples of the nitrogen-containing 5-membered ring compound (C) include 5-methyltetrazole, 5-aminotetrazole, 1,2,4-triazole, 1,2,3-triazole and tetrazole. Among them, at least one selected from the group consisting of 5-methyltetrazole, 5-aminotetrazole and 1,2,4-triazole is particularly preferred.

The concentration of the nitrogen-containing 5-membered ring compound (C) in the etchant is preferably 0.005 to 2.0% by mass, more preferably 0.01 to 1.0% by mass, and even more preferably 0.05 to 0.5% by mass relative to the total mass of the etchant. When the concentration of the nitrogen-containing 5-membered ring compound (C) is within the above-described range, a satisfactory etching rate is obtained. In addition, dissolution of wiring materials can be suppressed.

[Component (D)]

In the present invention, as the component (D), (d1) at least one pH adjuster selected from the group consisting of an alkali metal hydroxide, ammonia, an amine, and an ammonium salt, (d2) a phosphonic acid compound or (d3) a combination of (d1) and (d2) is contained. When the component (D) is contained, dissolution of wiring materials can be suppressed.

[Component (d1)]

The component (d1) is at least one pH adjuster selected from the group consisting of an alkali metal hydroxide, ammonia, an amine and an ammonium salt. When the component (d1) is contained, the pH of the etchant can be adjusted to be within an appropriate range.

The pH range of the etchant of the present invention is not particularly limited, but it is preferably 0.5 to 3.0, more preferably 0.6 to 3.0, even more preferably 0.7 to 2.0, particularly preferably 0.7 to 1.6, and most preferably 0.7 to 1.3. However, this is not applied to the case where the etchant of the present invention contains the component (d2) described later, and in this case, even when the pH range of the etchant is not within the above-described range, dissolution of wiring materials can be effectively suppressed.

The alkali metal hydroxide is not particularly limited as long as it is a hydroxide of an alkali metal, and examples thereof include potassium hydroxide, sodium hydroxide, lithium hydroxide and cesium hydroxide.

The amine is not particularly limited as long as it is a compound in which hydrogen atoms of ammonia are substituted with 1 to 3 organic groups, and examples thereof include: alkanolamines such as monoethanolamine, diethanolamine, triethanolamine, diethyleneglycolamine, 1-amino-2-propanol and N-hydroxylethylpiperazine; and organic amities not having a hydroxyl group such as ethylamine, benzylamine, diethylamine, n-butylamine, 3-methoxypropylamine, tert-butylamine, n-hexylamine, cyclohexylamine, n-octylamine, 2-ethylhexylamine, o-xylylenediamine, m-xylylenediamine, 1-methylbutylamine, ethylenediamine, 1,3-propanediamine, 2-aminobenzylamine, N-benzylethylenediamine, diethylenetriamine and triethylenetetramine.

The ammonium salt is not particularly limited as long as it is a water-soluble quaternary ammonium salt. Examples thereof include alkaline quaternary ammonium salts such as tetramethylammonium hydroxide, ethyltrimethylammonium hydroxide and tetraethylammonium hydroxide.

As the pH adjuster, for example, potassium hydroxide, sodium hydroxide, lithium hydroxide, cesium hydroxide, triethylamine, ammonia, tetramethylammonium hydroxide, ethanolamine, 1-amino-2-propanol, etc. can be preferably used. As the pH adjuster, one of such materials may be used solely, or two or more of them may be used in combination.

[Component (d2)]

The component (d2) is a phosphonic acid compound. As described above, in the case where the component (d2) is contained, even when the pH range of the etchant is not adjusted within a predetermined range, expected effects can be obtained.

Examples of the phosphonic acid compound include 1-hydroxyethylidene-1,1-diphosphonic acid (HEDP), aminotri(methylenephosphonic acid) (ATP), ethylenediaminetetra(methylenephosphonic acid) (EDTP), cis-cyclohexanediaminetetra(methylenephosphonic acid) (cis-CDTP), trans-cyclohexanediaminetetra(methylenephosphonic acid) (trans-CDTP), hexamethylenediaminetetra(methylenephosphonic acid) (HDTP), diethylenetriaminepenta(methylenephosphonic acid) (DTPP), triethylenetetraminehexa(methylenephosphonic acid) (TTHP), tri(2-aminoethyl)aminehexa(methylenephosphonic acid) (TAEHP), tetraethylenepentaminehepta(methylenephosphonic acid) (TPHP), pentaethylenehexamineocta(methylenephosphonic acid) (PHOP) and a salt thereof. Among them, at least one phosphonic acid compound selected from the group consisting of 1-hydroxyethylidene-1,1-diphosphonic acid (HEDP), diethylenetriaminepenta(methylenephosphonic acid) (DTPP) and a salt thereof is preferred, and at least one phosphonic acid compound selected from the group consisting of 1-hydroxyethylidene-1,1-diphosphonic acid (HEDP) and a salt thereof is particularly preferred. As the phosphonic acid compound, one of such materials may be used solely, or two or more of them may be used in combination.

The concentration of the component (d2) is preferably 0.005 to 1.0% by mass, more preferably 0.075 to 0.5% by mass, and particularly preferably 0.01 to 0.1% by mass relative to the total mass of the etchant.

[Component (d3)]

The etchant of the present invention may contain a combination of the component (d1) and the component (d2). In this case, it is sufficient when the concentrations of the component (d1) and the component (d2) are respectively within the above-described ranges, and the pH range may be outside the above-described range.

[Other Components]

In addition to the component (A), the component (B), the component (C) and the component (D), the etchant of the present invention may contain water, and according to need, at least one of additives usually used for other etchants within a range not impairing the effects of the etchant of the present invention.

Water is preferably water from which metal ions, organic impurities, particles, etc. have been removed by distillation, ion exchange treatment, filtering treatment, adsorption treatment or the like. Pure water is more preferred, and ultrapure water is particularly preferred.

Further, to the etchant of the present invention, a publicly-known hydrogen peroxide stabilizer such as alcohols, urea, phenylurea and organic carboxylic acids, an etching rate adjuster, etc. may be added according to need.

Note that the etchant of the present invention is preferably a solution and does not contain solid particles such as abrasive particles.

In the etchant of the present invention, the total content of the component (A), the component (B), the component (C), the component (D) and water is preferably 70 to 100% by mass, more preferably 85 to 100% by mass, even more preferably 90 to 100% by mass, and particularly preferably 95 to 100% by mass relative to the total mass of the etchant.

[Preparation of Etchant]

The etchant of the present invention can be prepared by homogeneously stirring the component (A), the component (B), the component (C), the component (D) and water, and according to need, other components. The method for stirring these components is not particularly limited, and a stirring method usually used for preparing an etchant can be employed.

[Intended Use of Etchant]

The etchant of the present invention can be used for etching copper and a copper alloy. In particular, at the time of wiring formation of a semiconductor substrate in which a bump such as TSV (Through Silicon Via) is used typified by next-generation DRAM memories and NAND memories, when at least one selected from the group consisting of nickel and a nickel alloy and at least one selected from the group consisting of tin, a tin alloy, gold and a gold alloy are contained as wiring materials, the etchant of the present invention can be suitably used as an etchant for selectively etching at least one selected from copper and a copper alloy while suppressing dissolution of the above-described metals.

The temperature of the etchant of the present invention at the time of use is not particularly limited, but it is preferably 10 to 50° C., more preferably 20 to 45° C., and even more preferably 25 to 40° C. When the temperature of the etchant is 10° C. or higher, a satisfactory etching rate is obtained, and therefore an excellent production efficiency is obtained. Meanwhile, when the temperature of the etchant is 50° C. or lower, it is possible to suppress change in a liquid composition and to keep etching conditions constant. The etching rate is increased by increasing the temperature of the etchant, but the optimum treatment temperature may be suitably determined in consideration of suppression of composition change of the etchant (decomposition of hydrogen peroxide), etc.

Further, the etching treatment time is not particularly limited, but it is preferably 20 to 240 seconds, and more preferably 30 to 120 seconds. The treatment time may be suitably selected depending on various conditions including surface conditions of an object to be etched, the concentration and temperature of the etchant and the treatment method.

The method for bringing an object to be etched into contact with the etchant is not particularly limited. For example, it is possible to employ a wet etching method such as a method of bringing the object to be etched into contact with the etchant by means of dropping (single wafer spin process), spray or the like, or a method of immersing the object to be etched in the etchant. In the present invention, any of such methods may be employed.

2. Method for Producing Semiconductor Substrate

The method for producing a semiconductor substrate of the present invention is characterized in that it comprises:
 a step of preparing a semiconductor base material having, on its surface, a copper seed layer containing at least one selected from the group consisting of copper and a copper alloy;
 a step of forming a resist pattern having an opening pattern, wherein the copper seed layer is partially exposed;
 a step of forming a metal layer A containing at least one selected from the group consisting of nickel and a nickel alloy and a metal layer B containing at least one selected from the group consisting of tin, a tin alloy, gold and a gold alloy to be arranged in this order on the surface of the copper seed layer exposed at an opening of the opening pattern of the resist pattern;
 a step of removing the resist pattern; and
 a step of bringing an exposed portion of the copper seed layer on which the metal layer A and the metal layer B are not formed, which is generated by removing the resist pattern, into contact with the etchant of the present invention to etch the exposed portion of the copper seed layer.

Hereinafter, an example of the method for producing a semiconductor substrate of the present invention will be described based on drawings.

[Step of Preparing Base Material]

In the step of preparing a base material, a semiconductor base material having, on its surface, a copper seed layer containing at least one selected from the group consisting of copper and a copper alloy is prepared.

Figure 1:
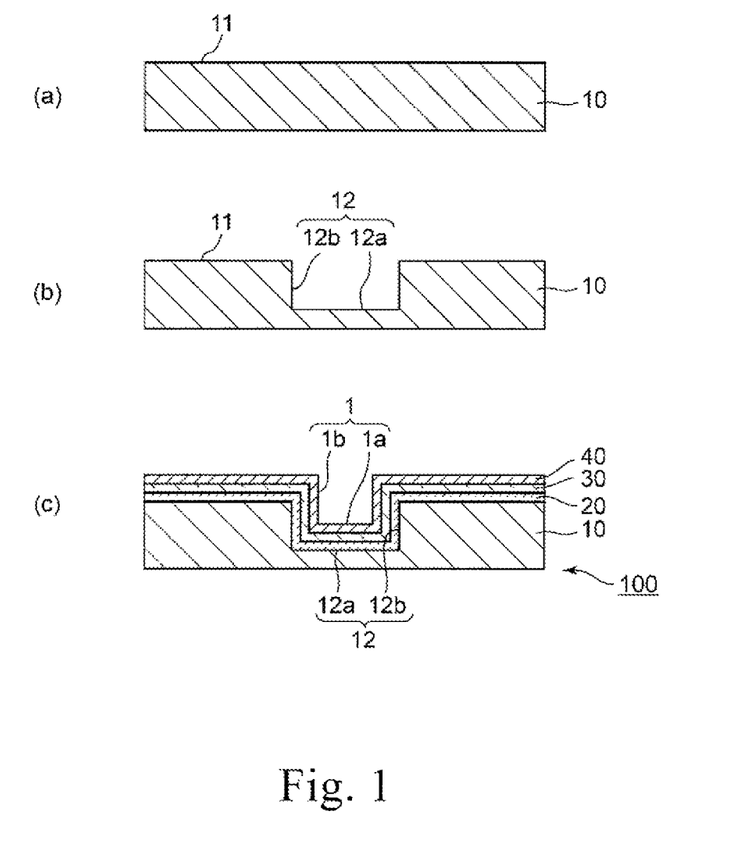

FIG. 1(a) to FIG. 1(c) are process drawings schematically showing an example of the step of preparing a base material.

Firstly, as shown in FIG. 1(a), a silicon substrate 10 having a plane portion 11 is prepared.

Next, as shown in FIG. 1(b), a recess 12 composed of a bottom 12a and a side 12b is formed in the plane portion 11 of the silicon substrate 10. The method for forming the recess 12 is not particularly limited, and an ordinary method such as a laser processing method and a drilling method can be employed.

Next, as shown in FIG. 1(c), a copper seed layer 40 is formed on the surfaces of the plane portion 11 and the bottom 12a and the side 12b of the recess 12 of the silicon substrate 10. Optionally, before forming the copper seed layer 40, a silicon oxide layer 20 may be formed and a barrier metal layer 30 such as a titanium layer may be formed thereon, and then the copper seed layer 40 may be formed thereon or another layer may be further added. In this way, in the recess 12, the copper seed layer 40 is formed, or the silicon oxide layer 20, the barrier metal layer 30 and the copper seed layer 40 are formed in this order, and as a result, a concave portion 1 having a bottom 1a and a side 1b which are composed of the copper seed layer 40 is formed. In this way, a semiconductor base material 100 having the copper seed layer 40 on its surface, wherein the concave portion 1 is formed, can be prepared. The method for forming the silicon oxide layer, the copper seed layer and the barrier metal layer is not particularly limited, and a publicly-known method can be used. For example, regarding the copper seed layer and the barrier metal layer, a sputtering method is preferably used.

[Step of Forming Resist Pattern]

Next, a resist pattern having an opening pattern, wherein the copper seed layer obtained in the aforementioned step is partially exposed, is formed.

Figure 2:
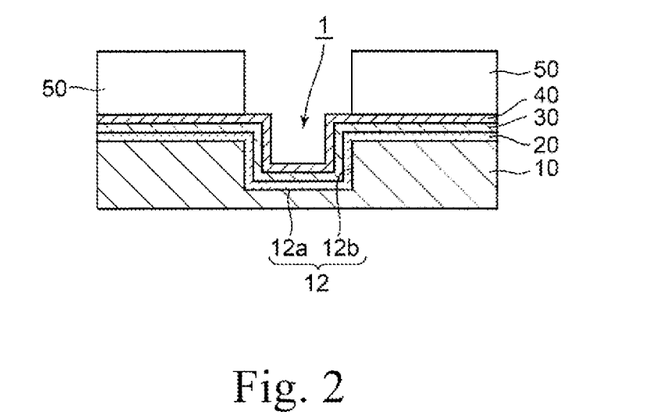
FIG. 2 is a process drawing schematically showing an example of the step of forming a resist pattern.

FIG. 2 is a process drawing schematically showing an example of the step of forming a resist pattern.

As shown in FIG. 2, a resist pattern is formed by forming a resist resin layer 50 on the surface of the copper seed layer 40 in a manner such that a part of the surface of the copper seed layer 40 from the edge toward the outside of the concave portion 1 is exposed. The method for forming the resist pattern is not particularly limited, and a publicly-known method can be used. For example, the resist pattern can be formed by exposing a pattern to light using a liquid resist or a dry film resist.

[Step of Forming Metal Layers]

Next, a metal layer A containing at least one selected from the group consisting of nickel and a nickel alloy and a metal layer B containing at least one selected from the group consisting of tin, a tin alloy, gold and a gold alloy are formed to be arranged in this order on the surface of the copper seed layer exposed at an opening of the opening pattern of the resist pattern formed in the aforementioned step.

Figure 3:
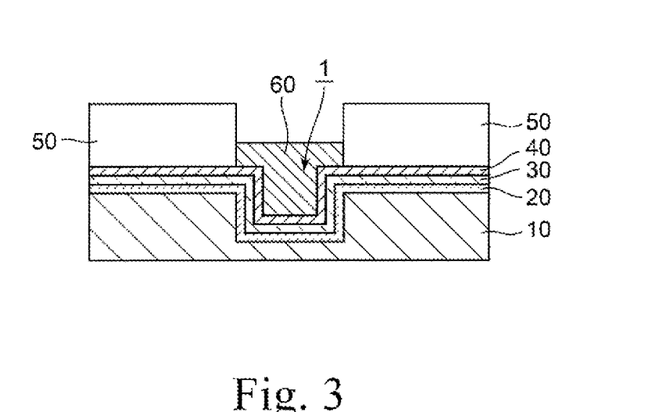
FIG. 3 is a process drawing schematically showing an example of the step of forming a copper plating layer.

FIG. 3 is a process drawing schematically showing an example of the step of forming a copper plating layer. As shown in FIG. 3, optionally, before forming the metal layers A and B, a copper plating layer 60 may be formed by performing copper plating in a manner such that the concave portion 1 is filled and the exposed portion of the copper seed layer 40 is covered.

Figure 4:
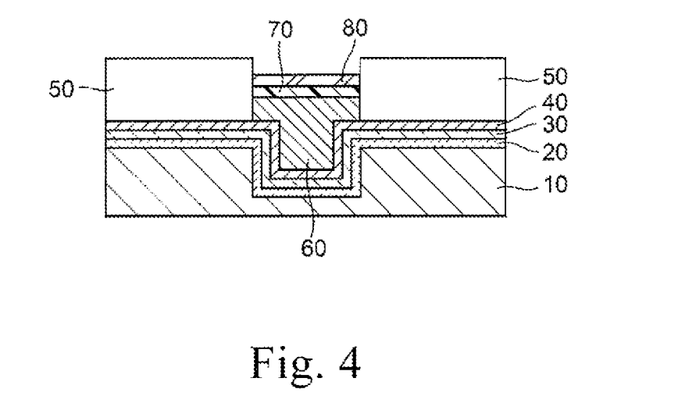
FIG. 4 is a process drawing schematically showing an example of the step of forming metal layers.

FIG. 4 is a process drawing schematically showing an example of the step of forming metal layers. As shown in FIG. 4, a metal layer A 70 and a metal layer B 80 are formed to be arranged in this order on the surface of the copper plating layer 60.

In another embodiment of the present invention, the copper plating layer and the metal layer A may be arranged in reverse order, and a metal layer A 60 may be formed in a manner such that the concave portion 1 is filled and the exposed portion of the copper seed layer 40 is covered, and a copper plating layer 70 and a metal layer B 80 may be formed to be arranged in this order on the surface of the metal layer A 60.

Further, it is not necessary to form a copper plating layer. In the case where no copper plating layer is formed, the metal layer A 70 and the metal layer B 80 are formed to be arranged in this order on the exposed portion of the copper seed layer 40. As each of the metal layer A and the metal layer B, one layer or two or more layers may be formed. Further, another layer may be formed between the metal layer A and the metal layer B or next to the metal layer A or the metal layer B. The method for forming the copper plating layer, the metal layer A, the metal layer B, etc. is not particularly limited, and a publicly-known method can be used. For example, electrolytic plating is preferably used.

[Step of Removing Resist Pattern]

Figure 5:
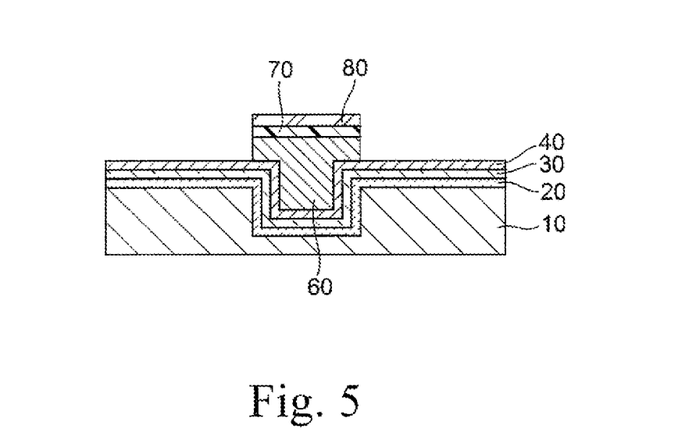
FIG. 5 is a process drawing schematically showing an example of the step of removing a resist pattern.

FIG. 5 is a process drawing schematically showing an example of the step of removing a resist pattern. As shown in FIG. 5, the resist resin layer 50 is removed. The method for removing the resist resin layer is not particularly limited, and a publicly-known method can be used.

[Step of Etching]

Figure 6:
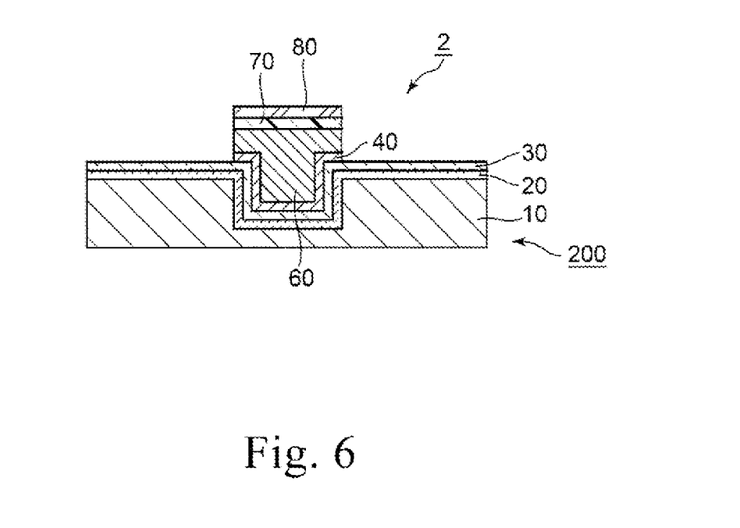
FIG. 6 is a process drawing schematically showing an example of the step of etching.

FIG. 6 is a process drawing schematically showing an example of the step of etching. As shown in FIG. 6, an exposed portion of the copper seed layer 40 on which the metal layer A 70 and the metal layer B 80 are not formed, which is generated by removing the resist pattern, is brought into contact with the etchant of the present invention to etch the exposed portion of the copper seed layer 40. In this way, a bump 2 having the copper seed layer 40, the copper plating layer 60, the metal layer A 70 and the metal layer B 80, wherein the barrier metal layer 30 is exposed, is formed. Note that the bump 2 may be composed of the copper seed layer 40, the metal layer A 60, the copper plating layer 70 and the metal layer B 80. Further, the copper plating layer is not required to be present. In this way, a semiconductor substrate 200 can be produced.

The temperature of the etchant is not particularly limited, but it is preferably 10 to 50° C., more preferably 20 to 45° C., and even more preferably 25 to 40° C. When the temperature of the etchant is 10° C. or higher, a satisfactory etching rate is obtained, and therefore an excellent production efficiency is obtained. Meanwhile, when the temperature of the etchant is 50° C. or lower, it is possible to suppress change in a liquid composition and to keep etching conditions constant. The etching rate is increased by increasing the temperature of the etchant, but the optimum treatment temperature may be suitably determined in consideration of suppression of composition change of the etchant (decomposition of hydrogen peroxide), etc.

The etching treatment time is not particularly limited, but it is preferably 20 to 240 seconds, and more preferably 30 to 120 seconds. The treatment time may be suitably selected depending on various conditions including surface conditions of an object to be etched, the concentration and temperature of the etchant and the treatment method.

[Step of Removing Barrier Metal Layer]

After the step of etching, the barrier metal layer is removed according to need.

Figure 7:
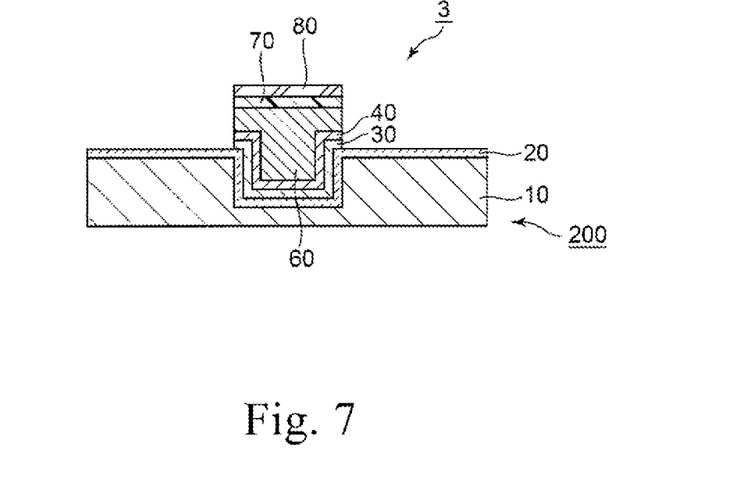
FIG. 7 is a process drawing schematically showing an example of the step of removing a barrier metal layer.

FIG. 7 is a process drawing schematically showing an example of the step of removing a barrier metal layer. As shown in FIG. 7, by removing the exposed portion of the barrier metal layer 30, a bump 3 having the barrier metal layer 30, the copper seed layer 40, the copper plating layer 60, the metal layer A 70 and the metal layer B 80 can be formed. Note that the bump 3 may be composed of the barrier metal layer 30, the copper seed layer 40, the metal layer A 60, the copper plating layer 70 and the metal layer B 80. Further, the copper plating layer is not required to be present. In this way, the semiconductor substrate 200 can be produced. The method for removing the barrier metal layer is not particularly limited, and a publicly-known method can be used.

In the above-described manner, it is possible to produce a semiconductor substrate, in which a bump comprising a metal layer A containing at least one selected from the group consisting of nickel and a nickel alloy and a metal layer B containing at least one selected from the group consisting of tin, a tin alloy, gold and a gold alloy is formed. According to a preferred embodiment of the present invention, the semiconductor substrate produced in the above-described manner is suitably used for TSV (Through Silicon Via) typified by next-generation DRAM memories and NAND memories, etc.

EXAMPLES

Hereinafter, the present invention will be specifically described based on working examples, but embodiments can be suitably changed within a range in which the effects of the present invention are exerted.

Examples 1-15

Using the composition described in Table 1, hydrogen peroxide (A); nitric acid (B); a nitrogen-containing 5-membered ring compound (C); a pH adjuster (d1), a phosphonic acid compound (d2) or a combination thereof (d3); and pure water were put into a glass beaker having a capacity of 1 L, and the mixture was stirred to be homogeneous to prepare an etchant. Note that the amount of the pH adjuster to be added was determined in a manner such that a desired pH was obtained when mixing all the materials.

Comparative Examples 1-9

An etchant was prepared in a manner similar to that in the above-described Examples, except that the composition described in Table 2 was used.

[Preparation of Substrate for Evaluation]

A substrate having the structure of FIG. 5 was used as a substrate for evaluation. As the barrier metal layer 30, a titanium layer was used. As the metal layer A 60, a nickel layer was used. As the layer 70, a copper plating layer was used. As the metal layer B 80, a gold layer was used in Example 14, a tin-silver alloy layer was used in Example 15, and a tin layer was used in Examples 1-13 and Comparative Examples 1-9 (other than Examples 14 and 15).

(1) Measurement of pH Value of Etchant

The pH value of each etchant prepared in the Examples and Comparative Examples was measured at 25° C. using a pH/ION meter of HORIBA, Ltd. (pH meter "D-53" manufactured by HORIBA, Ltd.), wherein an electrode was immersed in the etchant while stirring. The pH value of the pH measurement apparatus was adjusted using a standard solution having a pH of 4 or 7.

(2) Evaluation Regarding Etching Treatment Time of Copper Seed Layer and Corrosion The substrate for evaluation was subjected to the etching treatment using each etchant prepared in the Examples and Comparative Examples.

The substrate for evaluation was immersed in the etchant while stirring at a stirring rate of 200 rpm at 30° C. or 40° C., and the time that elapsed before the copper seed layer having a thickness of 600 µm was dissolved and the titanium layer appeared was measured, thereby evaluating the etching time (just etching time) of the copper seed layer.

For evaluation of corrosion of nickel, tin, gold and tin-silver alloy, an object was immersed for a time that was twice as long as the just etching time, and after that, it was washed with pure water, then dried, and observed using a scanning electron microscope as described later.

The just etching time (sec) was evaluated based on the below-described criteria. The evaluation criteria were as described below. E and G are regarded as acceptable.

E: 30 to 120 sec

G: 20 to 30 sec or 121 to 240 sec

B: less than 19 sec or more than 241 sec (3) Observation of Image of Scanning Electron Microscope (SEM)

The bump in the substrate for evaluation or the substrate after the etching treatment described in (2) above was cut using a focused ion beam processing device "FB2200" manufactured by Hitachi High-Technologies Corporation. The obtained cross section (cross section of the bump) was observed using a scanning electron microscope "S3400N" manufactured by Hitachi High-Technologies Corporation with a magnification of 3,000-fold (acceleration voltage: 5.0 kV, emission current: 30 µA), and the presence or absence of corrosion with respect to nickel, tin, gold and tin-silver alloy was confirmed. The evaluation criteria were as described below. E is regarded as acceptable.

E: corrosion was not confirmed by means of SEM (Decrease in bump diameter before and after treatment: less than 0.5 µm, no abnormalities on metal surface)

B: corrosion was confirmed by means of SEM

NE: it was impossible to perform the measurement because the copper seed layer was not etched WE: it was impossible to perform the measurement because it was impossible to confirm the presence or absence of a bump due to disappearance of the copper seed layer under the bump In the tables, "-" means that the corrosion test was not conducted.

The evaluation results of the Examples are shown in Table 1, and the evaluation results of the Comparative Examples are shown in Table 2. In the tables, "Remainder" means the content of pure water required when the amount of the etchant is 100% by mass.

TABLE 1

| | Etchant | | | | | | |
|---|---|---|---|---|---|---|---|
| | Hydrogen peroxide | Acid | | Nitrogen-containing 5-membered ring compound | | pH adjuster | pH |
| | % by mass | Compound name | % by mass | Compound name | % by mass | Compound name | (measurement value) |
| Example 1 | 5.8 | Nitric acid | 1.7 | 5-aminotetrazole | 0.06 | Potassium hydroxide | 1.0 |
| Example 2 | 6.5 | Nitric acid | 1.7 | 1,2,4-triazole | 0.08 | Potassium hydroxide | 1.0 |
| Example 3 | 10.0 | Nitric acid | 1.7 | 5-aminotetrazole | 0.06 | Potassium hydroxide | 1.0 |
| Example 4 | 7.4 | Nitric acid | 0.5 | 5-aminotetrazole | 0.08 | Potassium hydroxide | 1.0 |
| Example 5 | 7.4 | Nitric acid | 5.0 | 5-aminotetrazole | 0.08 | Potassium hydroxide | 1.0 |
| Example 6 | 7.4 | Nitric acid | 1.7 | 5-aminotetrazole | 0.04 | Potassium hydroxide | 1.0 |
| Example 7 | 7.4 | Nitric acid | 1.7 | 1,2,4-triazole | 1.0 | Potassium hydroxide | 1.0 |
| Example 8 | 7.4 | Nitric acid | 1.7 | 5-aminotetrazole | 0.08 | Sodium hydroxide | 0.7 |
| Example 9 | 7.4 | Nitric acid | 1.7 | 5-aminotetrazole | 0.08 | TMAH | 1.0 |
| Example 10 | 7.4 | Nitric acid | 1.7 | 5-aminotetrazole | 0.08 | Potassium hydroxide | 0.8 |
| Example 11 | 7.4 | Nitric acid | 1.7 | 5-aminotetrazole | 0.08 | Potassium hydroxide | 1.2 |
| Example 12 | 7.4 | Nitric acid | 2.1 | 5-aminotetrazole | 0.08 | — | — |
| Example 13 | 7.4 | Nitric acid | 1.7 | 5-aminotetrazole | 0.08 | Potassium hydroxide | 1.0 |
| Example 14 | 5.8 | Nitric acid | 1.7 | 5-aminotetrazole | 0.08 | Potassium hydroxide | 1.0 |
| Example 15 | 7.4 | Nitric acid | 1.7 | 5-aminotetrazole | 0.08 | Potassium hydroxide | 1.0 |

| | Etchant | | | Etching temperature for copper seed layer | Just etching time | Evaluation of nickel corrosion | Evaluation of tin corrosion | Evaluation of gold corrosion | Evaluation of tin-silver alloy corrosion |
|---|---|---|---|---|---|---|---|---|---|
| | Phosphonic acid compound | | Pure water | | | | | | |
| | Compound name | % by mass | % by mass | | | | | | |
| Example 1 | — | — | Remainder | 30° C. | E | E | E | — | — |
| Example 2 | — | — | Remainder | 30° C. | E | E | E | — | — |
| Example 3 | — | — | Remainder | 30° C. | E | E | E | — | — |
| Example 4 | — | — | Remainder | 40° C. | E | E | E | — | — |
| Example 5 | — | — | Remainder | 40° C. | E | E | E | — | — |
| Example 6 | — | — | Remainder | 30° C. | E | E | E | — | — |
| Example 7 | — | — | Remainder | 30° C. | G | E | E | — | — |
| Example 8 | — | — | Remainder | 30° C. | E | E | E | — | — |
| Example 9 | — | — | Remainder | 30° C. | E | E | E | — | — |
| Example 10 | — | — | Remainder | 30° C. | E | E | E | — | — |
| Example 11 | — | — | Remainder | 30° C. | E | E | E | — | — |
| Example 12 | HEDP | 0.1 | Remainder | 30° C. | E | E | E | — | — |
| Example 13 | DTPP | 0.01 | Remainder | 30° C. | E | E | E | — | — |
| Example 14 | — | — | Remainder | 30° C. | E | E | — | E | — |
| Example 15 | — | — | Remainder | 30° C. | E | E | — | — | E |

TABLE 2

| | Etchant | | | | | | |
|---|---|---|---|---|---|---|---|
| | Hydrogen peroxide | Acid | | Nitrogen-containing 5-membered ring compound | | pH adjuster | pH |
| | % by mass | Compound name | % by mass | Compound name | % by mass | Compound name | (measurement value) |
| Comparative Example 1 | 4.0 | Nitric acid | 1.7 | 5-aminotetrazole | 0.08 | Potassium hydroxide | 1.0 |
| Comparative Example 2 | 11.0 | Nitric acid | 1.7 | 5-aminotetrazole | 0.08 | Potassium hydroxide | 1.0 |
| Comparative Example 3 | 7.4 | Nitric acid | 0.2 | 5-aminotetrazole | 0.08 | Potassium hydroxide | 1.5 |
| Comparative Example 4 | 7.4 | Nitric acid | 7.0 | 5-aminotetrazole | 0.08 | Potassium hydroxide | 1.0 |
| Comparative Example 5 | 7.4 | — | — | 5-aminotetrazole | 0.08 | Potassium hydroxide | 5.0 |
| Comparative Example 6 | 7.4 | Sulfuric acid | 1.7 | 5-aminotetrazole | 0.08 | Potassium hydroxide | 1.0 |
| Comparative Example 7 | 7.4 | Nitric acid | 1.7 | 5-aminotetrazoie | 0.08 | — | — |

TABLE 2-continued

| | | | | | | | |
|---|---|---|---|---|---|---|---|
| Comparative Example 8 | 7.4 | Nitric acid | 1.7 | 1H-benzotriazole | 0.05 | Potassium hydroxide | 1.0 |
| Comparative Example 9 | 7.4 | Nitric acid | 1.7 | 5-phenyl-1-tetrazole | 0.02 | Potassium hydroxide | 1.0 |

| | Etchant | | | | | | |
|---|---|---|---|---|---|---|---|
| | Phosphonic acid compound | | Pure water | Etching temperature | Just etching time | Evaluation of nickel corrosion | Evaluation of tin corrosion | Evaluation of gold corrosion |
| | Compound name | % by mass | % by mass | for copper seed layer | | | | |
| Comparative Example 1 | — | — | Remainder | 30° C. | G | B | E | — |
| Comparative Example 2 | — | — | Remainder | 30° C. | E | E | B | — |
| Comparative Example 3 | — | — | Remainder | 30° C. | B | NE | NE | — |
| Comparative Example 4 | — | — | Remainder | 30° C. | B | B | B | — |
| Comparative Example 5 | — | — | Remainder | 30° C. | B | NE | NE | — |
| Comparative Example 6 | — | — | Remainder | 30° C. | E | B | E | — |
| Comparative Example 7 | — | — | Remainder | 30° C. | E | E | B | — |
| Comparative Example 8 | — | — | Remainder | 30° C. | G | B | B | — |
| Comparative Example 9 | — | — | Remainder | 30° C. | B | WE | WE | — |

As shown in Table 1, it was confirmed that copper was selectively etched by each of the etchants of Examples 1-15 successfully while suppressing corrosion of nickel, tin, gold and the tin-silver alloy.

Meanwhile, as shown in Table 2, when the composition ratio of the component (A) was not within the range defined by the present invention, corrosion of nickel or tin was caused (Comparative Examples 1 and 2). Further, when the composition ratio of the component (B) was not within the range defined by the present invention or the component (B) was not contained, etching of the copper seed layer did not proceed (Comparative Examples 3, 4 and 5).

It was found that when sulfuric acid was used instead of nitric acid as the component (B), etching of the copper seed layer proceeded, but corrosion of nickel was caused (Comparative Example 6). Further, it was found that when the component (D) was not contained, corrosion of tin was caused (Comparative Example 7).

When the nitrogen-containing 5-membered ring compound as the component (C) was not used, corrosion of nickel and tin was caused (Comparative Example 8), or etching of the copper seed layer did not proceed and a part or all of the bump collapsed (Comparative Example 9).

INDUSTRIAL APPLICABILITY

The etchant of the present invention can be suitably used for wiring formation of a semiconductor substrate in which a bump is used. According to a preferred embodiment of the present invention, copper and a copper alloy can be selectively etched while suppressing dissolution of wiring materials including nickel, a nickel alloy, tin, a tin alloy, gold and a gold alloy.

REFERENCE SIGNS LIST 1 concave portion
1a bottom of concave portion
1b side of concave portion
2, 3 bump
10 silicon substrate
11 plane portion
12 recess
12a bottom of recess
12b side of recess
20 silicon oxide layer
30 barrier metal layer
40 copper seed layer
50 resist resin layer
60 copper plating layer or metal layer A
70 metal layer A or copper plating layer
80 metal layer B
100 semiconductor base material
200 semiconductor substrate

The invention claimed is:

1. An etchant for selectively etching at least one selected from the group consisting of copper and a copper alloy in a semiconductor substrate, comprising:
  hydrogen peroxide in a range of 5 to 10.5% by mass relative to a total mass of the etchant;
  nitric acid in a range of 0.3 to 6% by mass relative to the total mass of the etchant;
  at least one nitrogen-containing 5-membered ring compound selected from the group consisting of a triazole and a tetrazole; and
  at least one pH adjuster selected from the group consisting of an alkali metal hydroxide, ammonia, an amine, and an ammonium salt, a phosphonic acid compound, or a combination of the at least one pH adjuster and the phosphonic acid compound,
  wherein the at least one nitrogen-containing 5-membered ring compound may have at least one substituent selected from the group consisting of a C1-6 alkyl group, an amino group, and a substituted amino group having at least one substituent selected from the group consisting of a C1-6 alkyl group and a phenyl group, and the semiconductor substrate comprises the at least one selected from the group consisting of copper and the copper alloy, at least one selected from the group consisting of nickel and a nickel alloy, and at least one selected from the group consisting of tin, a tin alloy, gold and a gold alloy.

2. The etchant according to claim 1, wherein the at least one nitrogen-containing 5-membered ring compound is selected from the group consisting of 5-methyltetrazole, 5-aminotetrazole and 1,2,4-triazole.

3. The etchant according to claim 1, wherein the at least one nitrogen-containing 5-membered ring compound is in a range of 0.005 to 2.0% by mass relative to the total mass of the etchant.

4. The etchant according to claim 1, wherein the etchant has a pH in a range of 0.5 to 3.0.

5. The etchant according to claim 4, wherein the etchant has a pH a range of 0.7 to 1.3.

6. The etchant according to claim 1, wherein the etchant includes the phosphonic acid compound.

7. The etchant according to claim 1, wherein the phosphonic acid compound is at least one phosphonic acid compound selected from the group consisting of 1-hydroxyethylidene-1,1-diphosphonic acid, diethylenetriaminepenta(methylenephosphonic acid) and a salt thereof.

8. The etchant according to claim 2, wherein the at least one nitrogen-containing 5-membered ring compound is in a range of 0.005 to 2.0% by mass relative to the total mass of the etchant.

9. The etchant according to claim 2, wherein the etchant has a pH in a range of 0.5 to 3.0.

10. The etchant according to claim 9, wherein the etchant has a pH in a range of 0.7 to 1.3.

11. The etchant according to claim 2, wherein the etchant includes the phosphonic acid compound.

12. The etchant according to claim 2, wherein the phosphonic acid compound is at least one phosphonic acid compound selected from the group consisting of 1-hydroxyethylidene-1,1-diphosphonic acid, diethylenetriaminepenta(methylenephosphonic acid) and a salt thereof.

13. The etchant according to claim 2, wherein the phosphonic acid compound is in a range of 0.005 to 1.0% by mass relative to the total mass of the etchant.

14. The etchant according to claim 3, wherein the etchant has a pH in a range of 0.5 to 3.0.

15. The etchant according to claim 14, wherein the etchant has a pH in a range of 0.7 to 1.3.

16. The etchant according to claim 3, wherein the etchant includes the phosphonic acid compound.

17. The etchant according to claim 3, wherein the phosphonic acid compound is at least one phosphonic acid compound selected from the group consisting of 1-hydroxyethylidene-1,1-diphosphonic acid, diethylenetriaminepenta(methylenephosphonic acid) and a salt thereof.

18. The etchant according to claim 1, wherein the phosphonic acid compound is in a range of 0.005 to 1.0% by mass relative to the total mass of the etchant.

19. A method for producing a semiconductor substrate, comprising:
preparing a semiconductor base material having, on a surface, a copper seed layer comprising at least one selected from the group consisting of copper and a copper alloy;
forming a resist pattern having an opening pattern such that the copper seed layer is partially exposed;
forming a metal layer A comprising at least one selected from the group consisting of nickel and a nickel alloy and a metal layer B comprising at least one selected from the group consisting of tin, a tin alloy, gold and a gold alloy to be in an order of the metal layer A and the metal layer B on a surface of the copper seed layer exposed at an opening of the opening pattern of the resist pattern;
removing the resist pattern; and
bringing an exposed portion of the copper seed layer on which the metal layer A and the metal layer B are not formed, which is formed by removing the resist pattern, into contact with an etchant to etch the exposed portion of the copper seed layer,
wherein the etchant comprises:
hydrogen peroxide in a range of 5 to 10.5% by mass relative to a total mass of the etchant;
nitric acid in a range of 0.3 to 6% by mass relative to the total mass of the etchant;
at least one nitrogen-containing 5-membered ring compound selected from the group consisting of a triazole and a tetrazole; and
at least one pH adjuster selected from the group consisting of an alkali metal hydroxide, ammonia, an amine, and an ammonium salt, a phosphonic acid compound, or a combination of the at least one pH adjuster and the phosphonic acid compound,
wherein the at least one nitrogen-containing 5-membered ring compound may have at least one substituent selected from the group consisting of a C1-6 alkyl group, an amino group, and a substituted amino group having at least one substituent selected from the group consisting of a C1-6 alkyl group and a phenyl group, and the semiconductor substrate comprises the at least one selected from the group consisting of copper and the copper alloy, at least one selected from the group consisting of nickel and a nickel alloy, and at least one selected from the group consisting of tin, a tin alloy, gold and a gold alloy.

20. The method for producing the semiconductor substrate according to claim 19, further comprising:
forming, on the semiconductor base material, a bump comprising the metal layer A comprising at least one selected from the group consisting of nickel and the nickel alloy and the metal layer B comprising at least one selected from the group consisting of tin, the tin alloy, gold and the gold alloy.

* * * * *